(12) United States Patent
Zhao et al.

(10) Patent No.: US 11,889,735 B2
(45) Date of Patent: Jan. 30, 2024

(54) ARRAY SUBSTRATES, DISPLAY PANELS AND DISPLAY APPARATUSES

(71) Applicants: Chengdu BOE Optoelectronics Technology Co., Ltd., Sichuan (CN); BOE Technology Group Co., Ltd., Beijing (CN)

(72) Inventors: Erjin Zhao, Beijing (CN); Zhiliang Jiang, Beijing (CN); Jun Yan, Beijing (CN); Lingran Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/908,093

(22) PCT Filed: Oct. 28, 2021

(86) PCT No.: PCT/CN2021/126884
§ 371 (c)(1),
(2) Date: Aug. 30, 2022

(87) PCT Pub. No.: WO2022/174615
PCT Pub. Date: Aug. 25, 2022

(65) Prior Publication Data
US 2023/0096167 A1   Mar. 30, 2023

(30) Foreign Application Priority Data
Feb. 20, 2021   (CN) .......................... 202110194139.4

(51) Int. Cl.
*H10K 59/40*     (2023.01)
*G06F 3/044*     (2006.01)
(Continued)

(52) U.S. Cl.
CPC ........... *H10K 59/40* (2023.02); *G06F 3/0446* (2019.05); *H10K 59/131* (2023.02); *H10K 59/65* (2023.02);
(Continued)

(58) Field of Classification Search
CPC ...... H10K 59/40; H10K 59/131; H10K 59/65; H10K 59/8731; H10K 59/122;
(Continued)

(56) References Cited

U.S. PATENT DOCUMENTS 9,632,487 B2 *   4/2017   Kim .................... H10K 59/1213
11,672,142 B2 *   6/2023   Lim ....................... H10K 77/10
                                                        313/512
(Continued)

FOREIGN PATENT DOCUMENTS

CN          107122077 A    9/2017
CN          109375802 A    2/2019
(Continued)

OTHER PUBLICATIONS

PCT/CN2021/126884 international search report.
PCT/CN2021/126884 Written Opinion.

*Primary Examiner* — Adam R. Giesy
(74) *Attorney, Agent, or Firm* — IPro, PLLC

(57) ABSTRACT

The present disclosure provides an array substrate, a display panel and a display apparatus to avoid influence of a steep slope of a planarization layer on touch performance. The array substrate includes a display region and a mounting hole located in the display region. A side of the mounting hole where a part of a mounting hole blocking column from which a distance of a display region blocking column is less than or equal to 2000 μm is located is denoted as a first side; the array substrate further includes a first metal electrode structure including a plurality of first metal electrodes dis- (Continued)

posed along a direction perpendicular to the first side, and each of the first metal electrodes includes a plurality of first metal electrode blocks electrically connected with each other in sequence; a size of a first metal electrode block adjoining the first side of the mounting hole expands outwardly in a direction of the first side on a basis of a size of a first metal electrode block not adjoining the first side of the mounting hole. The display panel includes the array substrate. The display apparatus includes the display panel.

20 Claims, 11 Drawing Sheets

(51) Int. Cl.
*H10K 59/131* (2023.01)
*H10K 59/65* (2023.01)
*H10K 50/842* (2023.01)
*H10K 50/844* (2023.01)
*H10K 50/84* (2023.01)

(52) U.S. Cl.
CPC ............ *H10K 50/84* (2023.02); *H10K 50/844* (2023.02); *H10K 50/8423* (2023.02); *H10K 50/8426* (2023.02); *H10K 50/8428* (2023.02)

(58) Field of Classification Search
CPC .... H10K 59/12; H10K 50/84; H10K 50/8423; H10K 50/8426; H10K 50/8428; H10K 50/844; G06F 3/0446; G06F 3/0412; G06F 3/04164; G06F 3/0443; G06F 2203/04103; H01L 27/1218; H01L 27/124
See application file for complete search history.

(56) References Cited

U.S. PATENT DOCUMENTS

2018/0046301 A1 2/2018 Zhou et al.
2020/0328267 A1* 10/2020 Li .................... H01L 27/1248

FOREIGN PATENT DOCUMENTS

CN 110007804 A 7/2019
CN 112968033 A 6/2021

* cited by examiner

ARRAY SUBSTRATES, DISPLAY PANELS AND DISPLAY APPARATUSES

CROSS-REFERENCE TO RELATED APPLICATIONS

This application is a national stage of international PCT Application No. PCT/CN2021/126884 filed on Oct. 28, 2021, the entire contents of which are incorporated herein by reference.

TECHNICAL FIELD

The present disclosure relates to the field of display technologies, and in particular to an array substrate, a display panel and a display apparatus.

BACKGROUND

In OLED products, in order to achieve full screen, a through hole is usually disposed in a display region of a display panel to place one or more functional devices such as camera.

SUMMARY

The present disclosure provides an array substrate and a display panel. A size of a first metal electrode block adjoining a first side of a mounting hole is expanded so as to avoid influence of a steep slope of a planarization layer on a touch performance when a distance between a mounting hole blocking column and a display region blocking column is less than or equal to 2000 μm.

According to a first aspect of embodiments of the present disclosure, there is provided an array substrate. The array substrate includes a display region and a mounting hole located in the display region, where a mounting hole blocking column is disposed at a periphery of the mounting hole, a display region blocking column is disposed at a periphery of the display region, and a side of the mounting hole where a part of the mounting hole blocking column from which a distance of the display region blocking column is less than or equal to 2000 μm is located is denoted as a first side.

The array substrate further includes a first metal electrode structure, where the first metal electrode structure includes a plurality of first metal electrodes disposed along a direction perpendicular to the first side, and each of the first metal electrodes includes a plurality of first metal electrode blocks electrically connected with each other in sequence.

A size of a first metal electrode block adjoining the first side of the mounting hole expands outwardly in a direction of the first side on a basis of a size of a first metal electrode block not adjoining the first side of the mounting hole.

Optionally, the size of the first metal electrode block adjoining the first side of the mounting hole expands toward both sides along the direction of the first side or expands unilaterally toward a neighboring end point of the first side on the basis of the size of the first metal electrode block not adjoining the first side of the mounting hole.

Optionally, an area of the first metal electrode block adjoining the first side of the mounting hole expands by 10% to 50% on a basis of an area of the first metal electrode block not adjoining the first side of the mounting hole.

Optionally, an edge, in close contact with the mounting hole, of the first metal electrode block adjoining the first side of the mounting hole has a length of 3500 μm to 4900 μm.

Optionally, two adjacent first metal electrodes are not mutually overlapped.

Optionally, the array substrate further includes a second metal electrode structure, where the second metal electrode structure includes a plurality of second metal electrodes disposed along a direction parallel to the first side, and each of the second metal electrodes includes a plurality of second metal electrode blocks electrically connected with each other in sequence.

Optionally, a size of a second metal electrode block adjoining the first side of the mounting hole shrinks inwardly along the direction of the first side on a basis of a shape of a second metal electrode block not adjoining the mounting hole, and a decrease in the size of the second metal electrode block due to shrinking inwardly corresponds to an increase in the size of the first metal electrode block adjoining the second metal electrode block due to expanding outwardly.

Optionally, a planarization layer is formed under the first metal electrode structure, and the planarization layer includes a climbing region located in a region in which a distance between the mounting hole blocking column and the display region blocking column is less than or equal to 2000 μm, and the first metal electrode block, after size expansion, has at least partial region not having overlapping area with the climbing region of the planarization layer.

Optionally, the mounting hole further includes a second side opposed to the first side, first metal electrode blocks respectively adjoining the first side and the second side in the first metal electrode are connected with each other through a first metal connection line, and the first metal connection line is disposed along the periphery of the mounting hole.

According to a second aspect of embodiments of the present disclosure, there is provided a display panel, including the array substrate mentioned above.

According to a third aspect of embodiments of the present disclosure, there is provided a display apparatus, including the display panel mentioned above.

In the array substrate, the display panel and the display apparatus of the present disclosure, the size of the first metal electrode block adjoining the first side of the mounting hole is expanded, so as to avoid influence of the steep slope of the planarization layer on touch performance when the distance between the mounting hole blocking column and the display region blocking column is less than or equal to 2000 μm.

DETAILED DESCRIPTION OF THE EMBODIMENTS

Figure 1:
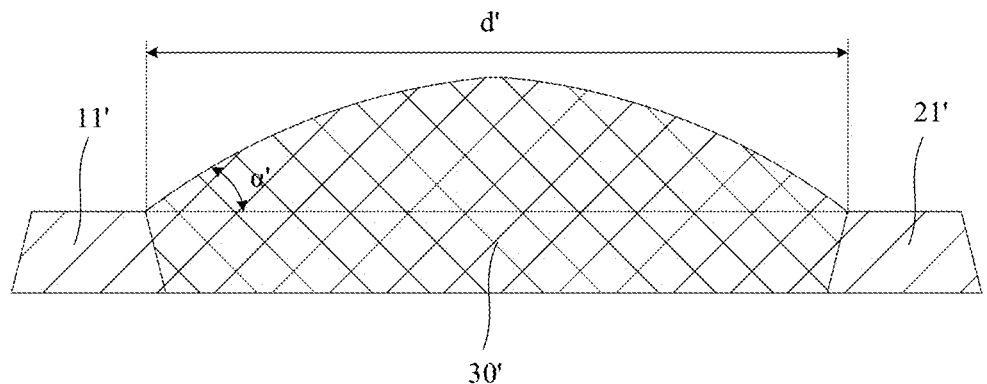
FIG. 1 is a schematic diagram illustrating a sectional structure of a planarization layer formed in a first circumstance.

Examples will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses consistent with some aspects of the present disclosure as detailed in the appended claims.

The terms used in the present disclosure are for the purpose of describing particular examples only, and are not intended to limit the present disclosure. Unless otherwise defined, technical terms or scientific terms used in the present disclosure should have general meanings that can be understood by ordinary persons of skill in the art. Terms "one" or "a" and the like used in the specification and the claims do not represent quantity limitation but represent at least one. Terms "include" or "contain" or the like are intended to refer to that an element or object appearing before "include" or "contain" covers an element or object or its equivalents listed after "include" or "contain" and does not preclude other elements or objects. "Connect" or "connect with" or the like is not limited to physical or mechanical connection but includes direct or indirect electrical connection. "A plurality" represents two, which is equivalent to at least two. The singular forms such as "a", 'said", and "the" used in the present disclosure and the appended claims are also intended to include multiple, unless the context clearly indicates otherwise. It is also to be understood that the term "and/or" as used herein refers to and includes any or all possible combinations of one or more associated listed items.

For a product in which a mounting hole is provided in a display region of a display panel, size and position of the mounting hole usually affect formation of a touch metal layer of a Flexible Multi-Layer On Cell (FMLOC, also known as Flexible AMOLED Touch Integrated Display Device). When a distance between a blocking column of the mounting hole and a display region blocking column (e.g. an upper edge) disposed at an outer edge of the display region is too close, for example, the distance is reduced from about 3000 μm to below 2000 μm, a climbing space for forming a planarization layer is reduced, In this case, printing morphology of the planarization layer may be presented as a steep mound shape, and a slope and a height difference both may be increased, where a maximum height difference may be close to 10 μm. Especially, when the mounting hole is a racetrack shaped hole, because the racetrack shaped hole has two opposed long sides parallel to the outer edge of the display region, the effect of this configuration on the formation of the planarization layer is particularly prominent.

When a distance d' between the mounting hole blocking column 21' and the display region blocking column 11' is about 3000 μm (denoted as a first circumstance), a sectional structure of the planarization layer 30' formed is shown in FIG. 1. In this circumstance, the planarization layer may be squeezed by the mounting hole blocking column and the display region blocking column so as to form a morphology with a middle position high and positions neighboring blocking columns on two side low. In some embodiments, a slope angle α' may be about 0.3 to 0.4°.

In some embodiments, the distance d' between the mounting hole blocking column 21' and the display region blocking column 11' may be about 2800 to 3500 μm.

Figure 2:
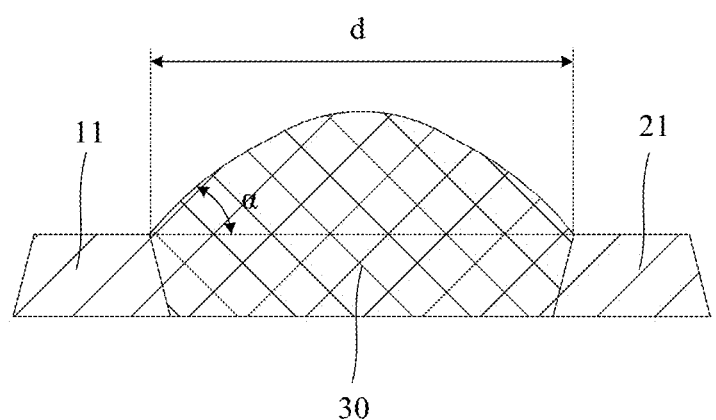
FIG. 2 is a schematic diagram illustrating a sectional structure of a planarization layer formed in a second circumstance.

When a distance d between the mounting hole blocking column 21 and the display region blocking column 11 is 2000 μm (denoted as a second circumstance), a sectional structure of the planarization layer 30 formed is shown in FIG. 2. In this circumstance, since a climbing distance for the planarization layer is obviously shortened, the slope is steeper. In some embodiments, the slope angle α is about 0.7 to 1°.

In some embodiments, a printing thickness of the planarization layer 30 is about 12 μm. In some embodiments, a maximum thickness of the planarization layer formed when the distance d between the mounting hole blocking column 21 and the display region blocking column 11 is 2000 μm is greater than a maximum thickness of the planarization layer formed when the distance d' between the mounting hole blocking column 21' and the display region blocking column 11' is about 2800 to 3500 μm.

The steep slope of the planarization layer directly results in that a metal line cannot be normally covered with a negative photoresist, leading to overexposure and even breakage/open during an exposure process of forming a touch metal layer. In this case, signals above the hole cannot be communicated into the display region, bringing influence to touch performance.

Figure 3:
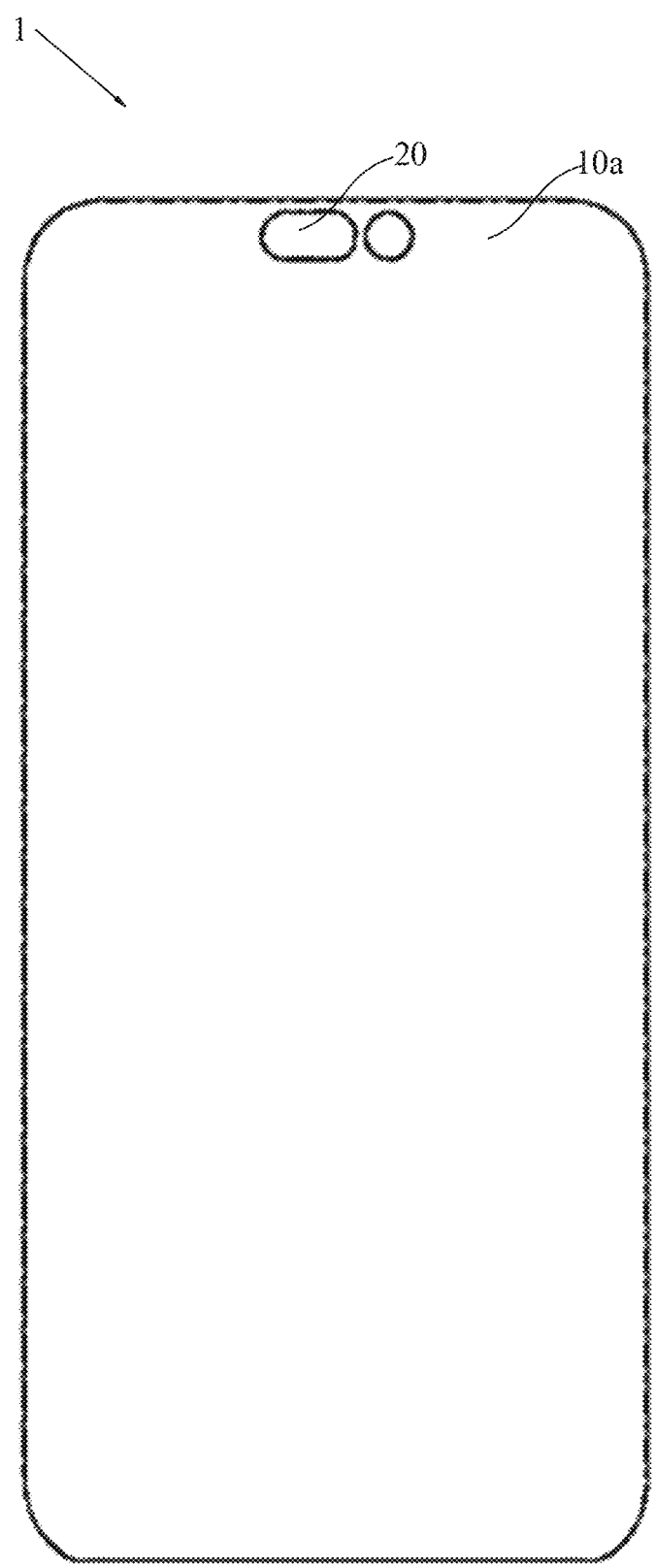
FIG. 3 is a top view of a structure of an array substrate according to an exemplary embodiment of the present disclosure.
Figure 4:
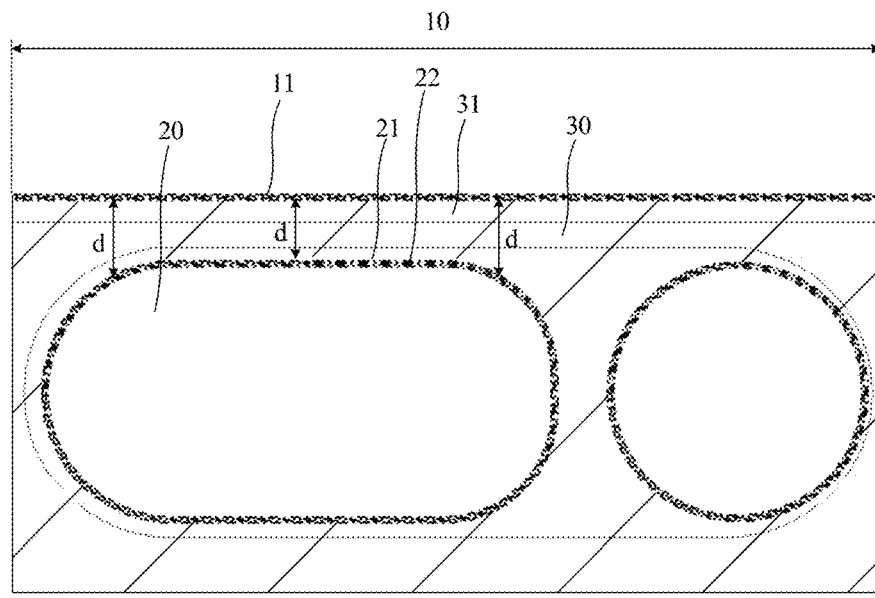
FIG. 4 is a top view of a structure of a mounting hole blocking column, a display region blocking column and a planarization layer in an array substrate according to an exemplary embodiment of the present disclosure.
Figure 6:
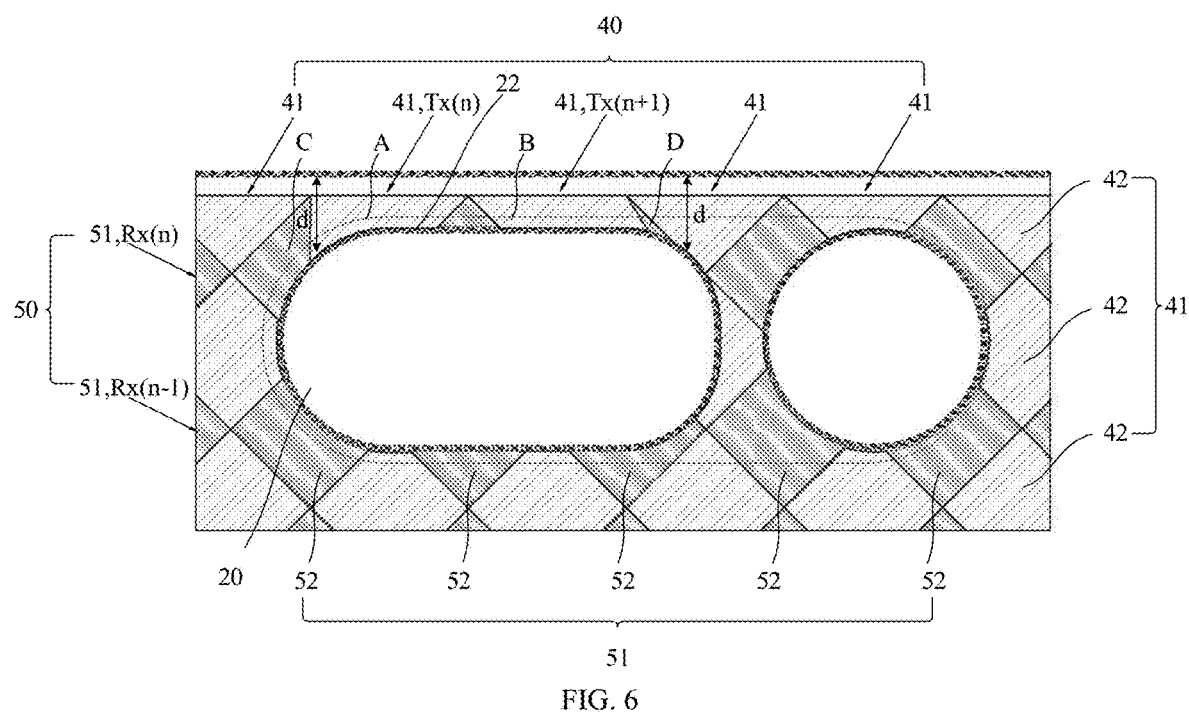
FIG. 6 is a top view of a structure of a first metal electrode structure and a second metal electrode structure after a size of a first metal electrode block adjoining a first side of a mounting hole is expanded according to an exemplary embodiment of the present disclosure.
Figure 7:
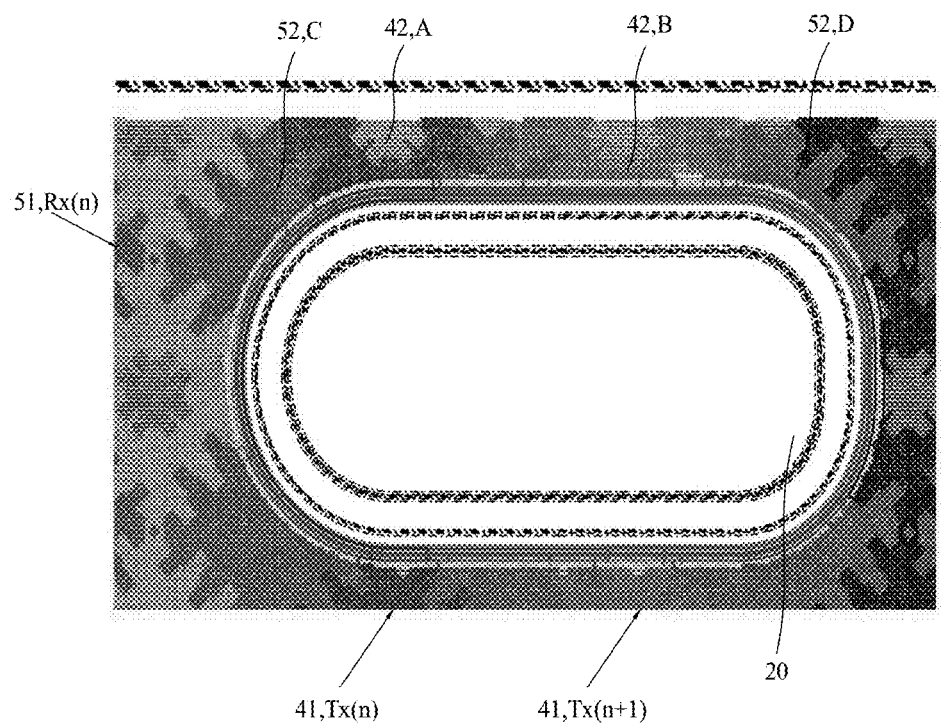
FIG. 7 is a top view of an actual structure of a first metal electrode structure and a second metal electrode structure when a size of a first metal electrode block adjoining a first side of a mounting hole is not expanded according to an exemplary embodiment of the present disclosure.
Figure 8:
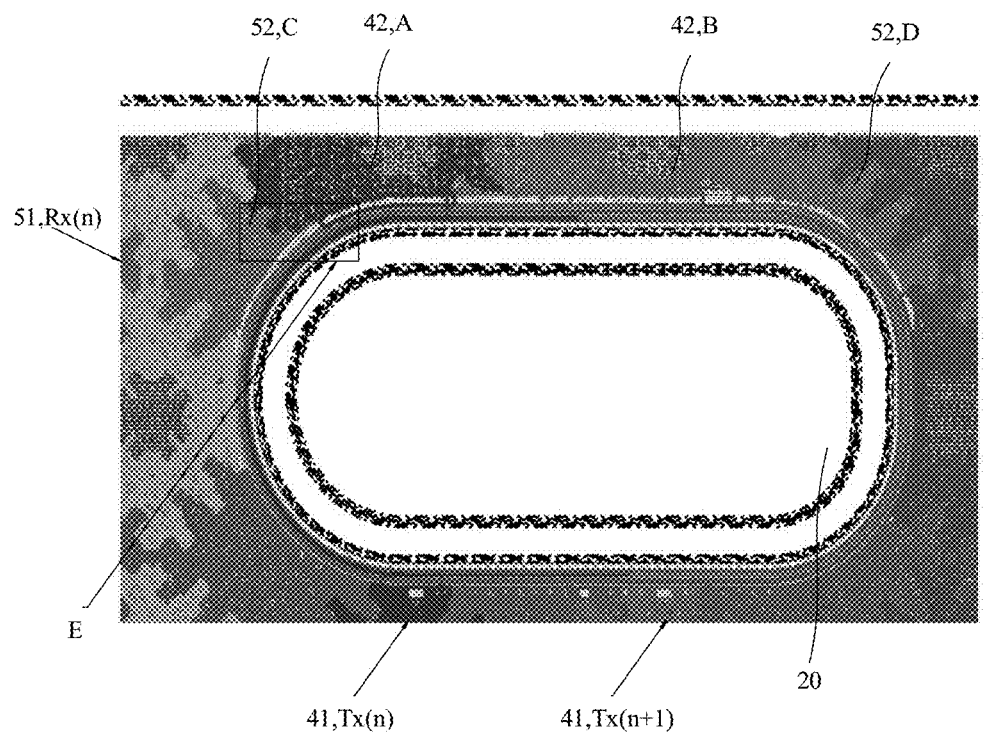
FIG. 8 is a top view of an actual structure of a first metal electrode structure and a second metal electrode structure after a size of a first metal electrode block adjoining a first side of a mounting hole is expanded according to an exemplary embodiment of the present disclosure.
Figure 9:
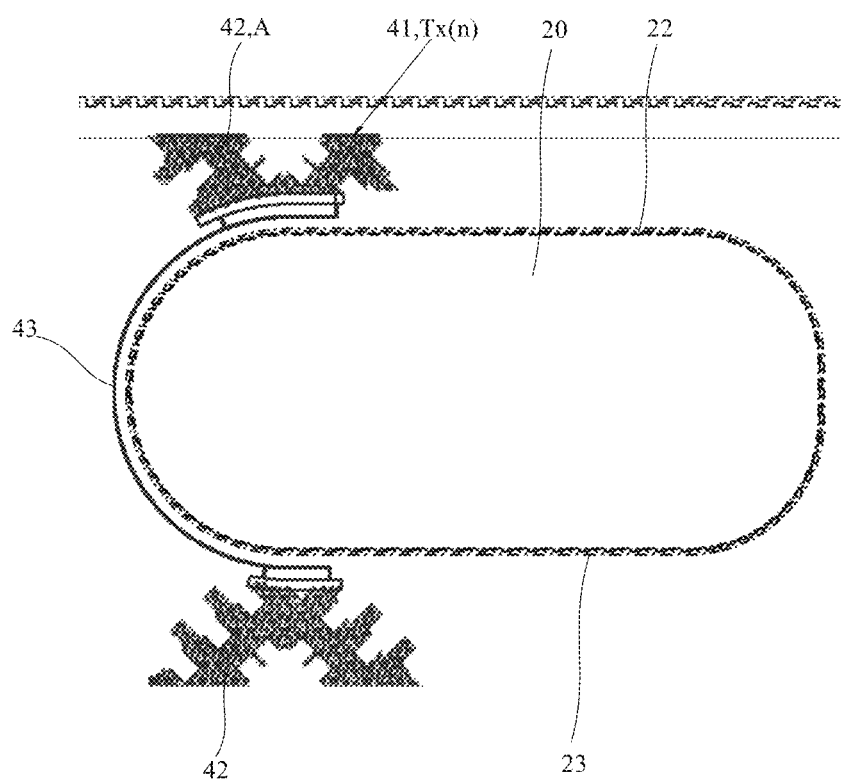
FIG. 9 is a top view of an actual structure of a first metal electrode block A before size expansion according to an exemplary embodiment of the present disclosure.
Figure 10:
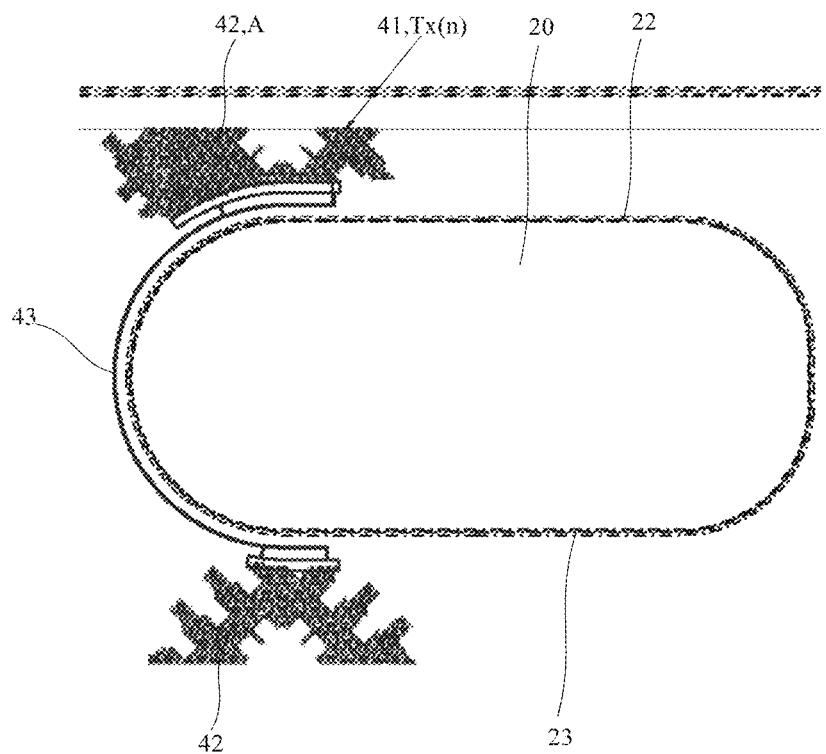
FIG. 10 is a top view of an actual structure of a first metal electrode block A after size expansion according to an exemplary embodiment of the present disclosure.
Figure 11:
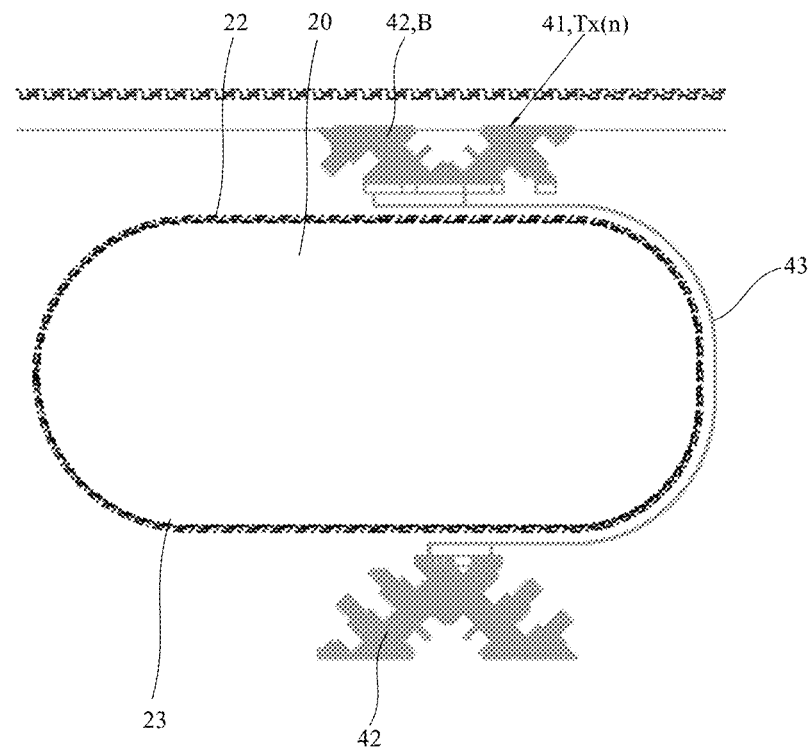
FIG. 11 is a top view of an actual structure of a first metal electrode block B before size expansion according to an exemplary embodiment of the present disclosure.
Figure 12:
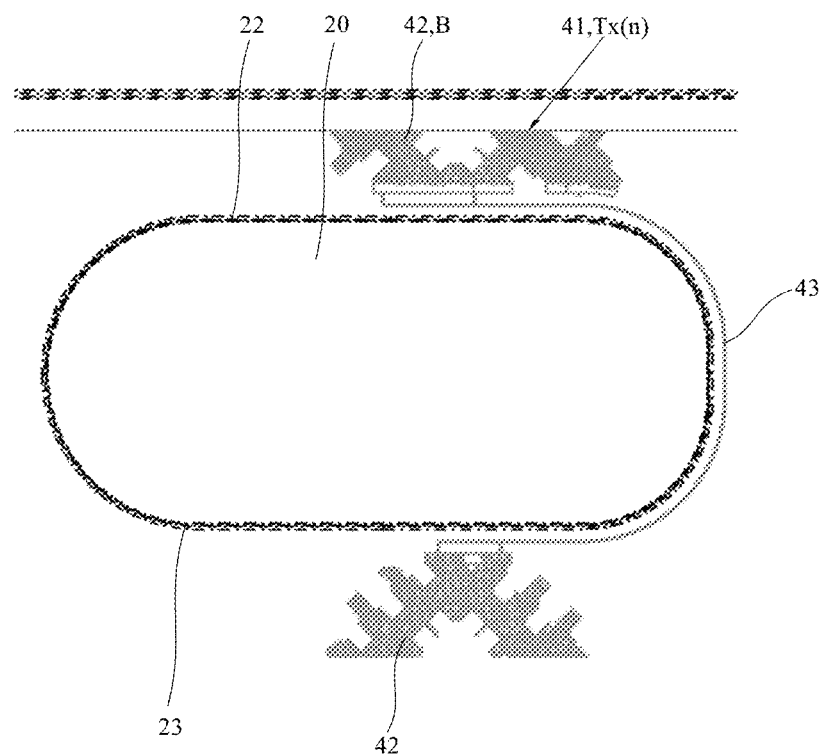
FIG. 12 is a top view of an actual structure of a first metal electrode block B after size expansion according to an exemplary embodiment of the present disclosure.
Figure 13:
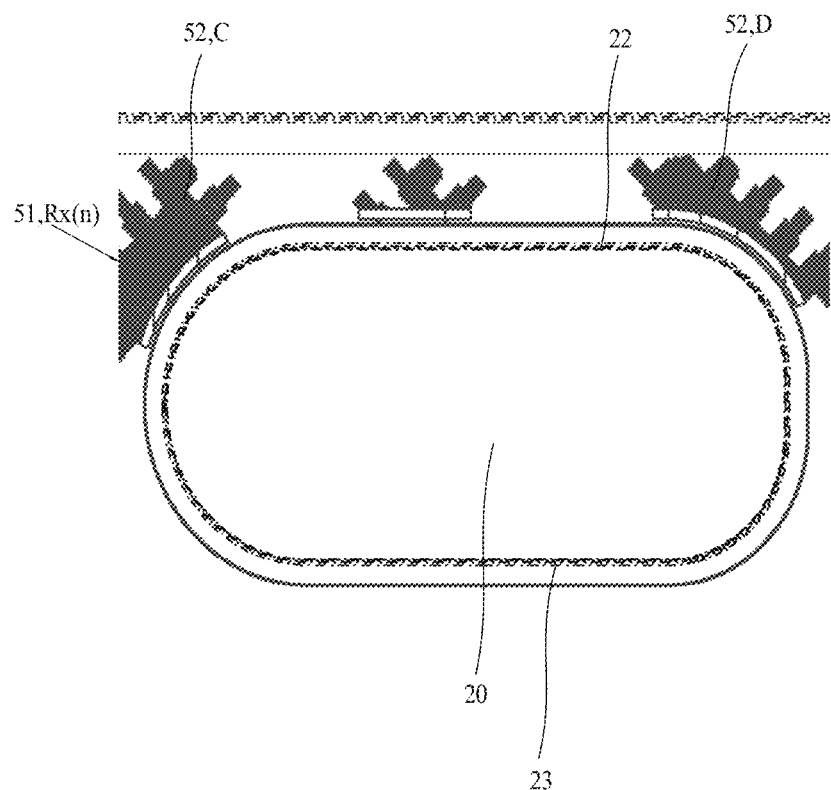
FIG. 13 is a top view of an actual structure of second metal electrode blocks C and D before size shrinkage according to an exemplary embodiment of the present disclosure.
Figure 14:
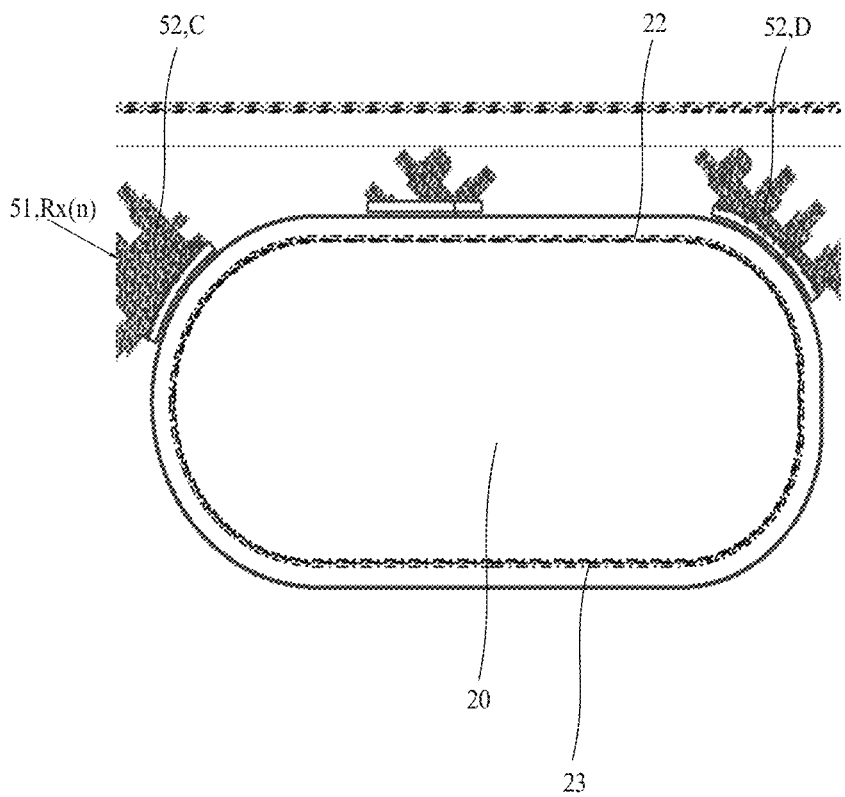
FIG. 14 is a top view of an actual structure of second metal electrode blocks C and D after size shrinkage according to an exemplary embodiment of the present disclosure.
Figure 15:
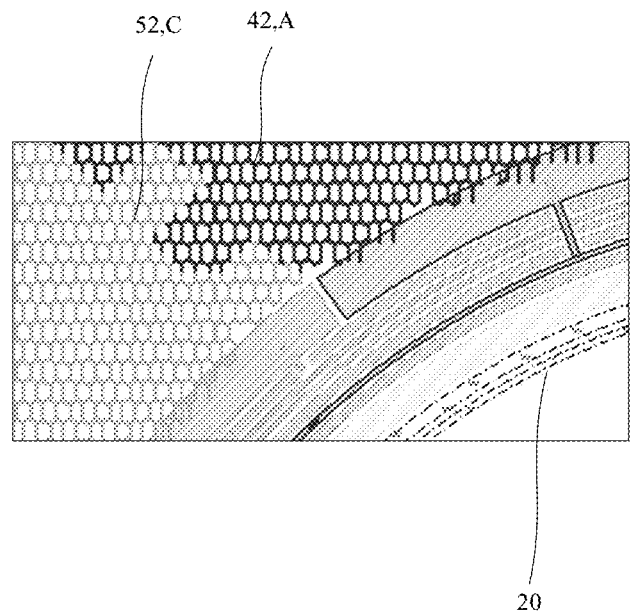
FIG. 15 is a partially enlarged view of a part E in FIG. 8.

In combination with FIGS. 3, 4 and 6 for further understanding, some embodiments of the present disclosure provide an array substrate 1. The array substrate 1 includes a display region 10a and a mounting hole 20 located in the display region 10a. In some embodiments, the mounting hole may be a racetrack shaped hole as shown in FIG. 3. In some embodiments, the mounting hole may alternatively be another shape such as circle or square and the like. In some embodiments, a maximum span of the mounting hole 20 is between 4500 μm and 10000 μm.

Figure 16:
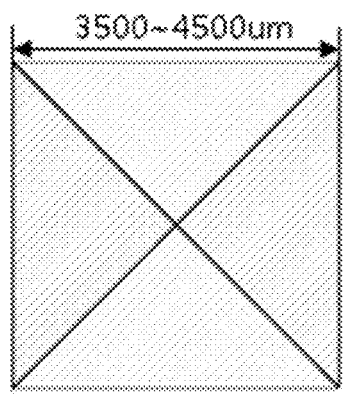
FIG. 16 is a structural schematic diagram of a touch unit according to an exemplary embodiment of the present disclosure.

In some embodiments, the maximum span of the racetrack shaped hole is between 9700 μm and 10000 μm. The maximum span of the circular hole is about 4500 μm. The above maximum span refers to a linear distance between two points farthest apart in the shape. In some embodiments, as shown in FIG. 16, a size of a touch unit is about between 3500 μm and 4500 μm. One touch unit herein is defined as a unit composed of a half of each of four adjacent touch electrodes, with its size shown by a double-headed arrow in the drawing. In some embodiments, the maximum span of the mounting hole is 2 to 3 times the size of one touch unit.

Of course, none of the values in all the embodiments of the present disclosure is strictly limited. Values within process and measuring error range are accepted and the values may fluctuate up and down to a certain degree. For example, the maximum span of the mounting hole 20 between 4500 μm and 10000 μm as described above may fluctuate up and down by 10%.

In some embodiments, the mounting hole may be a through hole, or blind hole or their combination. The through hole means a hole that penetrates through all film layers and structures of the array substrate, and the blind hole means a hole that penetrates through part of the film layers and structures of the array substrate.

Furthermore, as shown in FIGS. 4 and 6, a mounting hole blocking column 21 is disposed at a periphery of the mounting hole 20, and a display region blocking column 11 is disposed at a periphery of the display region 10a.

A side of the mounting hole 20 where the mounting hole blocking column 21 from which a distance d of the display region blocking column 11 is less than or equal to 2000 μm is located is denoted as a first side 22. That is, the first side 22 is a side closer to the periphery of the display region 10a.

The array substrate 1 further includes a first metal electrode structure 40 and a second metal electrode structure 50. The first metal electrode structure 40 and the second metal electrode structure 50 jointly form a touch metal layer.

The first metal electrode structure 40 includes a plurality of first metal electrodes 41 disposed along a direction perpendicular to the first side 22, and each of the first metal electrodes 41 includes a plurality of first metal electrode blocks 42 electrically connected with each other in sequence.

The second metal electrode structure 50 includes a plurality of second metal electrodes 51 disposed along a direction parallel to the first side 22, and each of the second metal electrodes 51 includes a plurality of second metal electrode blocks 52 electrically connected with each other in sequence.

In the present embodiment, the first metal electrode structure 40 is a Tx drive channel layer and the second metal electrode structure 50 is a Rx response channel layer. Alternatively, the first metal electrode structure 40 is a Rx response channel layer and the second metal electrode structure 50 is a Tx drive channel layer.

In some embodiments, the first metal electrode structure 40 further includes connection portions electrically connecting the plurality of first metal electrode blocks 42. In some embodiments, the connection portions and the plurality of first metal electrode blocks 42 are disposed in a same layer.

In some embodiments, the second metal electrode structure 50 further includes bridging portions electrically connecting the plurality of second metal electrode blocks 52. In some embodiments, the bridging portions and the plurality of second metal electrode blocks 52 are disposed in different layers.

The size of the first metal electrode block 42 adjoining the first side 22 of the mounting hole 20 outwardly expands substantially in a direction of the first side 22 on the basis of the size of the first metal electrode block 42 not adjoining the first side 22 of the mounting hole 20. The manner in which the size outwardly expands may be that the size expands toward both sides along the direction of the first side 22, or expands unilaterally toward a neighboring end point of the first side 22, or expands outward along an extension direction of the mounting hole 20 (the extension direction of the mounting hole 20 refers to a direction in which a central position of the mounting hole 20 extends outwardly along a radial direction of the mounting hole 20). The "substantially" used above means that the direction of outward expansion may be at an included angle to the direction of the first side 22, but is substantially along the direction of the first side 22. The outward expansion refers to a direction pointing to another electrode pattern relative to an electrode pattern itself.

Correspondingly, the size of the second metal electrode block 52 adjoining the first side 22 of the mounting hole 20 inwardly shrinks substantially along the direction of the first side 22 on the basis of a size of the second metal electrode block 52 not adjoining the mounting hole 20. The inward shrinkage refers to a direction pointing to an electrode pattern itself relative to the electrode pattern itself. The decrease in size as a result of inward shrinkage of the second metal electrode block 52 equals to the increase in size as a result of outward expansion of the first metal electrode block 42 adjoining the second metal electrode block 52.

In this way, the size of the first metal electrode blocks 42 adjoining the first side 22 of the mounting hole 20 is expanded so as to avoid influence of the steep slope of the planarization layer 30 on touch performance when the distance between the mounting hole blocking column and the display region blocking column is less than or equal to 2000 μm. That is, the planarization layer 30 includes a climbing region 31 located in a region in which a distance between the mounting hole blocking column 21 and the display region blocking column 11 is less than or equal to 2000 μm. The first metal electrode blocks 42 and the second metal electrode blocks 52 both are formed on the planarization layer 30. The distance between the mounting hole blocking column 21 and the display region blocking column 11 is too short (less than or equal to 2000 μm), shortening the climbing space for forming the planarization layer. In this case, printing morphology of the planarization layer is presented as a steep mound shape, and the slope and the height difference both are increased, where the maximum height difference may be close to 10 μm.

In some embodiments, the slope angle α of the planarization layer 30 is 0.3 to 1°. In some embodiments, the slope angle α of the planarization layer 30 is 0.7 to 1°.

Two adjacent first metal electrodes 41 are not mutually overlapped, that is, even if the first metal electrode block 42 expands outwardly, the two adjacent first metal electrodes 41 still remain mutually non-overlapped, so as to maintain the functionality of the second metal electrode 51 between the two adjacent first metal electrodes 41.

Figure 5:
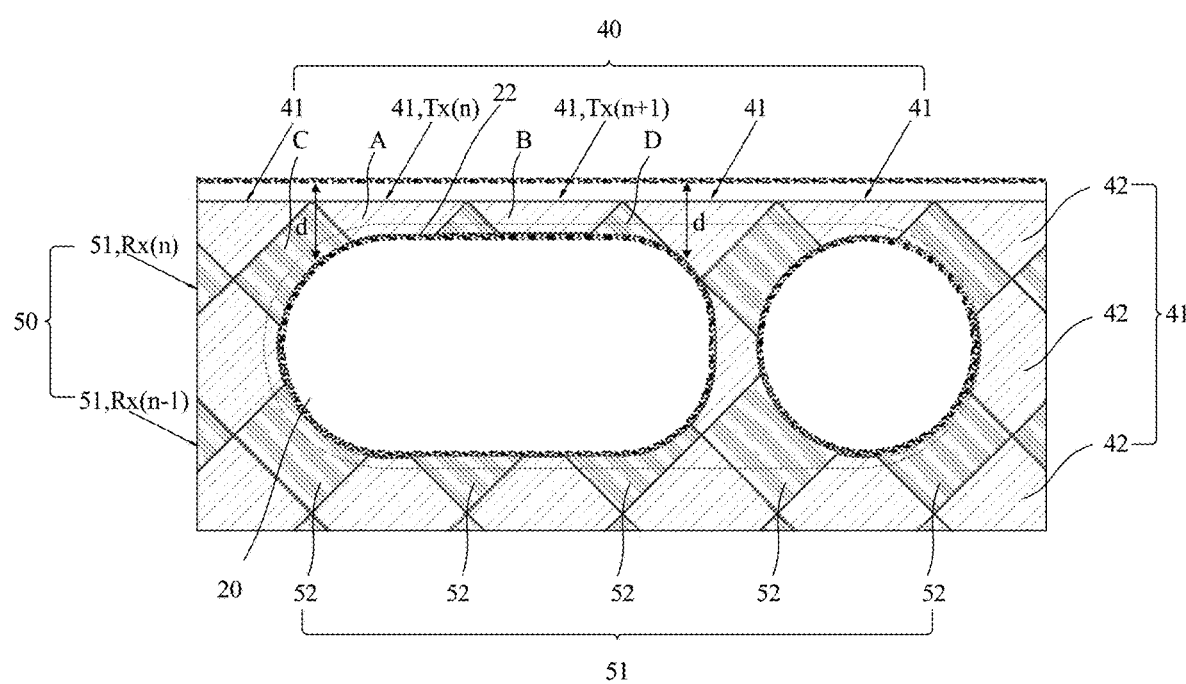
FIG. 5 is a top view of a structure of a first metal electrode structure and a second metal electrode structure when a size of a first metal electrode block adjoining a first side of a mounting hole is not expanded according to an exemplary embodiment of the present disclosure.

FIG. 5 is a structural schematic diagram of the first metal electrode blocks 42 adjoining the first side 22 of the mounting hole 20 before size expansion. In FIG. 5, the first metal electrodes 41 are disposed along the direction perpendicular to the first side 22, that is, signals are communicated into at least one end of top and bottom ends of the first metal electrode 41. Along the direction of the first side 22 from left to right, the first first metal electrode 41 adjoining the mounting hole 20 is denoted as a metal electrode Tx(n), and the first metal electrode block 42, adjoining the first side 22 of the mounting hole 20, of the metal electrode Tx(n) is denoted as a first metal electrode block A; the second first metal electrode 41 adjoining the mounting hole 20 is denoted as a metal electrode Tx(n+1), and the first metal electrode block 42, adjoining the first side 22 of the mounting hole 20, of the metal electrode Tx(n+1) is denoted as a first metal electrode block B.

The second metal electrodes 51 are disposed along the direction parallel to the first side 22, that is, signals are communicated into left and right ends of the second metal electrode 51. Along the direction perpendicular to the first side 22 from top to bottom, the first second metal electrode 51 adjoining the mounting hole 20 is denoted as a metal electrode Rx(n), and the second metal electrode block 52, adjoining the left side of the first metal electrode block A, of the metal electrode Rx(n) is denoted as a second metal electrode block C; and the second metal electrode block 52, adjoining the right side of the first metal electrode block B, of the metal electrode Rx(n) is denoted as a second metal electrode block D. The second second metal electrode 51 adjoining the mounting hole 20 is denoted as a metal electrode Rx(n−1).

The first metal electrode blocks 42 adjoining the first side 22 of the mounting hole 20 have the same size as the first metal electrode blocks 42 at other positions (the first metal electrode blocks 42 not adjoining the first side 22 of the mounting hole 20). But, the first metal electrode block A and the first metal electrode block B are affected by the steep climbing region of the planarization layer 30. In some embodiments, the climbing region 31 of the planarization layer 30 has at least partial overlapping area with the first metal electrode block A and/or the first metal electrode block B.

As shown in FIG. 6, after the size of the first metal electrode blocks 42 adjoining the first side 22 of the mounting hole 20 expands, the expansion in size of the first metal electrode block A, adjoining the first side 22 of the mounting hole 22, in the metal electrode Tx(n) toward a neighboring end point of the first side 22 includes at least one of area expansion, extension of the length of the edge in close contact with the mounting hole 20 and increase of the size along the direction of the first side 22, i.e. expansion toward the left end point of the first side 22 in the drawing. The first metal electrode block A occupies a partial space for the second metal electrode block C adjoining the left side of the first metal electrode block A so as to go away as much as possible from the steep climbing region of the planarization layer 30. In some embodiments, the first metal electrode block 42, after size expansion, has at least partial region not having overlapping area with the climbing region 31 of the planarization layer 30.

The expansion in size of the first metal electrode block B, adjoining the first side 22 of the mounting hole 22, in the metal electrode Tx(n+1) toward a neighboring end point of the first side 22 includes at least one of area expansion, extension of the length of the edge in close contact with the mounting hole 20 and increase of the size along the direction of the first side 22, i.e. expansion toward the right end point of the first side 22 in the drawing. The first metal electrode block B occupies a partial space for the second metal electrode block D adjoining the right side of the first metal electrode block B so as to go away as much as possible from the steep climbing region of the planarization layer 30. In some embodiments, the first metal electrode block 42, after size expansion, has at least partial region not having overlapping area with the climbing region of the planarization layer.

In some embodiments, the area of the first metal electrode block 42 adjoining the first side 22 of the mounting hole 20 expands by 10% to 50% on the basis of the area of the first metal electrode block 42 not adjoining the first side 22 of the mounting hole 20.

The length of the edge, in close contact with the mounting hole 20, of the first metal electrode block 42 adjoining the first side 22 of the mounting hole 20 is 3500 μm to 4900 μm, that is, the size along the direction of the first side 22 is about 400 μm greater than original size.

It is noted that the first metal electrode block 42 is usually in the shape of a diamond, a usual size of the first metal electrode block 42 along the direction of the first side 22 is 3500 μm to 4500 μm, and a usual size along the direction perpendicular to the first side 22 is also 3500 μm to 4500 μm. Similarly, the second metal electrode block 52 is usually in the shape of a diamond, a usual size of the second metal electrode block 52 along the direction of the first side 22 is 3500 μm to 4500 μm, and a usual size along the direction perpendicular to the first side 22 is also 3500 μm to 4500 μm. By referring to FIGS. 5, 6, and 9 to 12, after the size of the first metal electrode blocks 42 adjoining the first side 22 of the racetrack shaped mounting hole 20 expands, the edge of the first metal electrode block A, adjoining the first side 22 of the racetrack shaped mounting hole 20, of the metal electrode Tx(n) extends outwardly along the periphery of the mounting hole, such that the length of the extended edge is greater than original length. The length of the extended edge is 3500 μm to 4900 μm. Since the distance d between the mounting hole blocking column 21 near the first side 22 of the mounting hole 20 and the display region blocking column 11 is less than or equal to 2000 μm, partial structure of the first metal electrode block A in this region may be cut off upon meeting with the mounting hole 20, such that the length of the edge of the first metal electrode block A is less than or equal to its usual size along the direction of the first side 22, i.e. is 3100 μm to 4500 μm, whereas the size of the extended edge is 3500 μm to 4900 μm (the edge of each of the first metal electrode blocks 42 that meet left and right sides of the mounting hole 20 may further extend downwardly along the periphery of the mounting hole, such that the length of the edge is longer than a maximum usual size 4500 μm along the direction of the first side 22). The first metal electrode block B, adjoining the first side 22 of the racetrack shaped mounting hole 20, of the metal electrode Tx(n+1) has the same situation. Since the planarization layer 30 corresponding to the first metal electrode block 42 not adjoining the first side 22 of the mounting hole 20 does not have a steep slope, the first metal electrode block 42 retains its original usual size (refer to the above contents and no redundant descriptions are made herein). To avoid the influence of the steep slope of the planarization layer 30 on the touch performance, the size of the first metal electrode block 42 adjoining the first side 22 of the mounting hole 20 expand along the direction parallel to the first side 22. That is, the first metal electrode block 42 occupies the areas of the adjacent second metal electrode blocks 52 on the left and right sides so as to go away as possible from the steep climbing region of the planarization layer 30, thereby retaining normal metal trace to ensure uniform etching and normal bidirectional drive function.

It is to be noted that the component structures in FIGS. 5 and 6 are illustrative to demonstrate changes of the first metal electrode blocks 42 and the second metal electrode blocks 52. For their actual structures, reference may be made to FIGS. 7 to 15. To better demonstrate the specification of the first metal electrode block A and the first metal electrode block B before and after expansion and the second metal electrode block C and the second metal electrode block D before and after shrinkage, the change of each metal electrode block is shown separately in FIGS. 9 to 14.

Comparison of the first metal electrode block A and the first metal electrode block B before and after expansion and the second metal electrode block C and the second metal electrode block D before and after shrinkage is shown in the following table (see the following page).

|  | Before expansion/ shrinkage | After expansion/ shrinkage | Difference |
| --- | --- | --- | --- |
| The area of the first metal electrode block A/$\mu m^2$ | 301260 | 438698 | +45.6% |
| The capacitance of the first metal electrode block A/pF | 3147 | 4454 | +41.5% |
| The area of the second metal electrode block C/$\mu m^2$ | 537176 | 373088 | −30.5% |
| The capacitance of the second metal electrode block C/pF | 5474 | 3910 | −28.6% |
| The area of the first metal electrode block B/$\mu m^2$ | 372324 | 438653 | +17.8% |
| The capacitance of the first metal electrode block B/pF | 3071 | 3616 | +17.7% |
| The area of the second metal electrode block D/$\mu m^2$ | 374923 | 263803 | −29.6% |
| The capacitance of the second metal electrode block D/pF | 3292 | 2338 | −29.0% |

Corresponding protrusions and grooves are disposed at the peripheries of the first metal electrode blocks 42 and the second metal electrode blocks 52 to increase a sensing area. In some embodiments, the first metal electrode blocks 42 and the second metal electrode blocks 52 both are metal grids.

The mounting hole 20 further includes a second side 23 opposed to the first side 22. The first metal electrode blocks 42 respectively adjoining the first side 22 and the second side 23 in the first metal electrode 41 are connected with each other through a first metal connection line 43, and the first metal connection line 43 is disposed along the periphery of the mounting hole 20.

Figure 17:
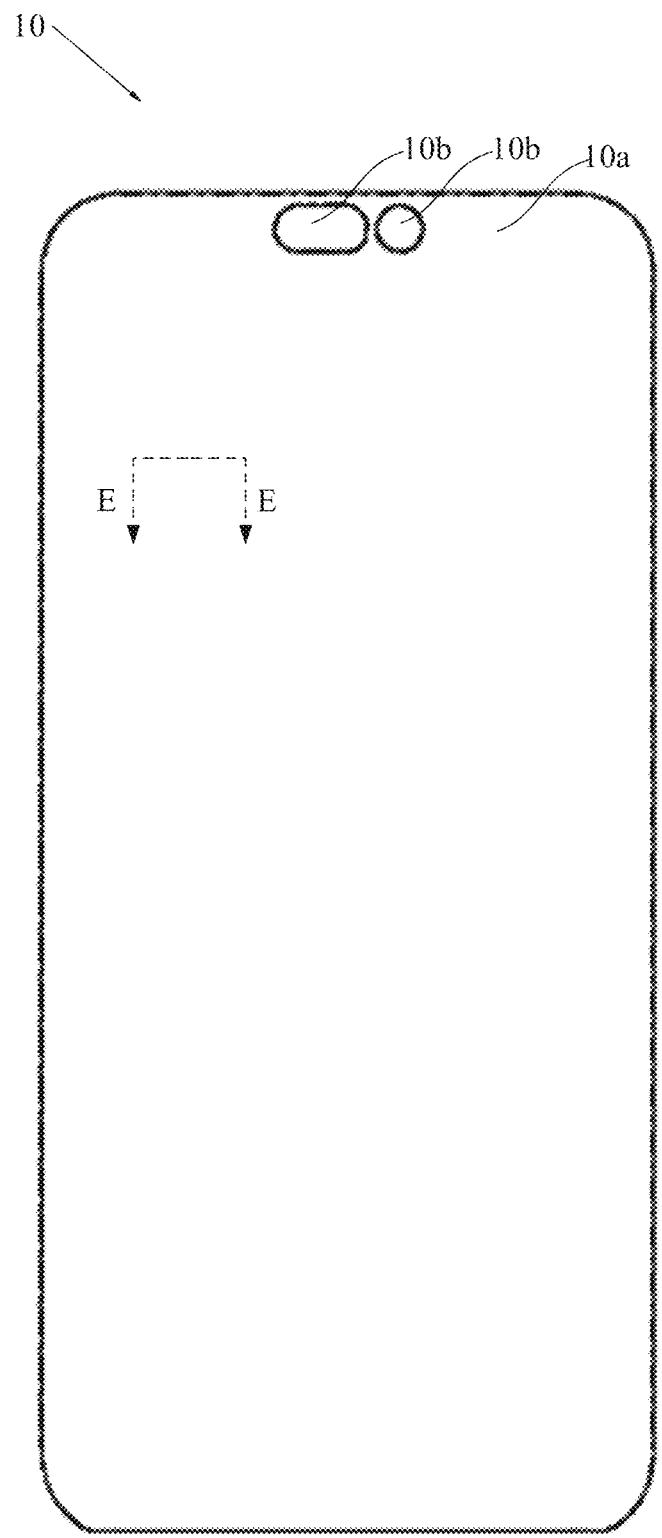
FIG. 17 is a top view of a structure of a display panel according to an exemplary embodiment of the present disclosure.
Figure 18:
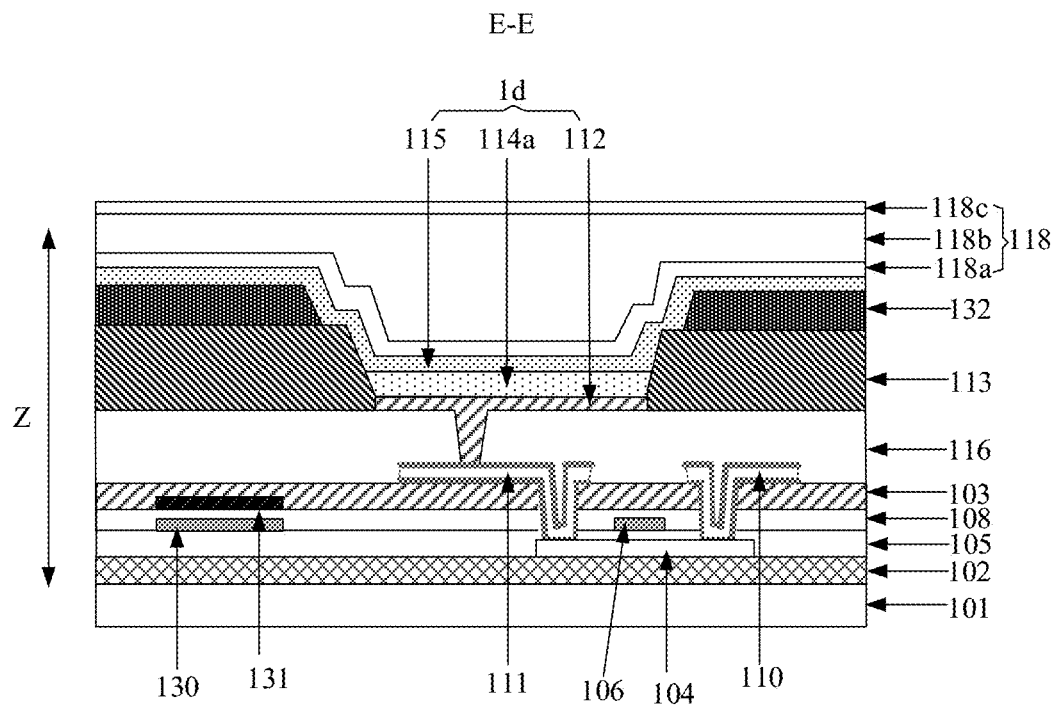
FIG. 18 is a sectional view of the display panel taken along E-E according to an embodiment shown in FIG. 17.
Figure 19:
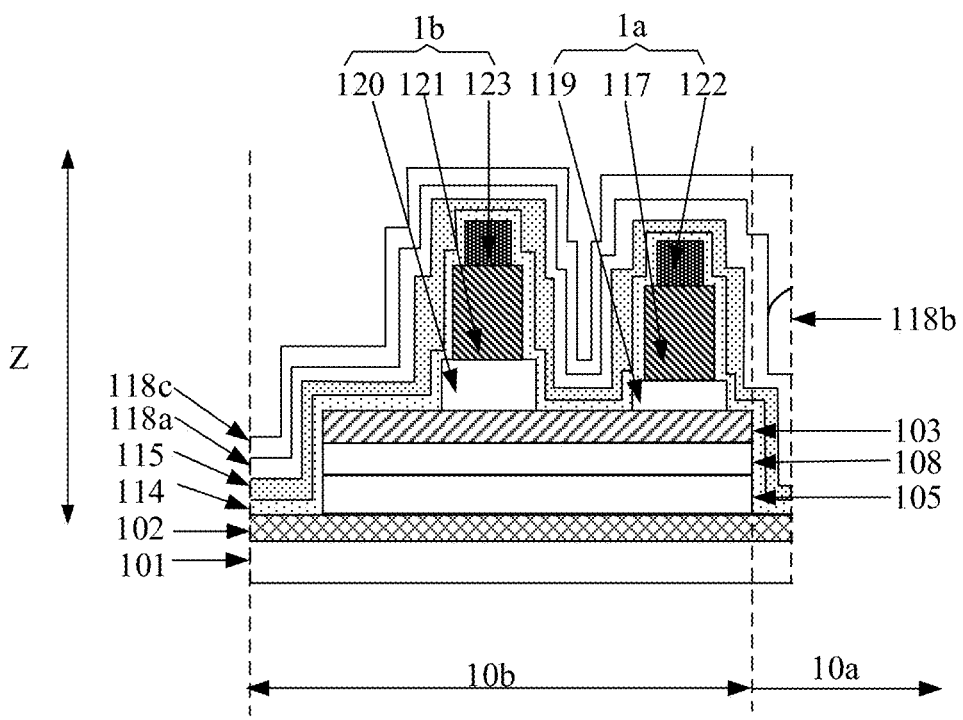
FIG. 19 is a sectional view of a mounting hole blocking column according to an exemplary embodiment of the present disclosure.

As shown in FIGS. 17 to 19, an embodiment of the present disclosure further provides a display panel including the array substrate mentioned above. In some embodiments, the display panel may be an OLED display panel, including a base substrate, and a drive backplate, display devices, an encapsulation layer and the above array substrate stacked in sequence on the base substrate. The encapsulation layer includes a first inorganic encapsulation film layer, an organic encapsulation film layer and a second inorganic encapsulation film layer, and the organic encapsulation film layer is the above planarization layer. The first metal electrode structure and the second metal electrode structure of the array substrate both are formed on the planarization layer.

The display panel 10 includes a display region 10a and a hole region 10b, where the display region of the array substrate corresponds to the display region 10a and the mounting hole of the array substrate corresponds to the hole region 10b.

The base substrate may be of single layer structure or multilayer structure. Along a thickness direction Z, the base substrate may include a polyimide layer 101 and a buffer layer 102 stacked in sequence. In some other embodiments, the base substrate may include a plurality of polyimide layers 101 and buffer layers 102 stacked in sequence. The buffer layer 102 may be made of materials such as silicon nitride or silicon oxide to achieve the effect of blocking water, oxygen and basic ions. It is noted that the structure of the base substrate is not limited hereto and may be determined based on actual requirements.

It is noted that, to facilitate subsequent processing of necessary components on each region of the display panel, each region may be firstly defined on the base substrate, for example, a display region and a hole region may be firstly divided on the base substrate.

A part of the drive backplate located in the display region may include thin film transistors and capacitor structures.

Each of the thin film transistors may be of top gate type. The thin film transistor may include an active layer 104, a first gate insulation layer 105, a gate electrode 106, a second gate insulation layer 108, an inter-layer dielectric layer 103, a source electrode 110 and a drain electrode 111. In some embodiments, the active layer 104 may be formed on the buffer layer 102, and the first gate insulation layer 105 covers the buffer layer 102 and the active layer 104. The gate electrode 106 is formed on a side of the first gate insulation layer 105 away from the active layer 104, the second gate insulation layer 108 covers the gate electrode 106 and the first gate insulation layer 105, and the inter-layer dielectric layer 103 covers the second gate insulation layer 108. The source electrode 110 and the drain electrode 111 are formed on a side of the inter-layer dielectric layer 103 away from the base substrate and located at two opposed sides of the gate electrode 106. The source electrode 110 and the drain electrode 111 may be in contact with two opposed sides of the active layer 104 through via holes (e.g. metal via holes) respectively. It should be understood that the thin film transistor may be of bottom gate type. A planarization portion 116 is further formed between the inter-layer dielectric layer 103 and a first electrode 112.

Each of the capacitor structures may include a first plate 130 and a second plate 131. The first plate 130 and the gate electrode 106 are disposed in a same layer, and the second plate 131 is located between the second gate insulation layer 108 and the inter-layer dielectric layer 103 and disposed to be opposed to the first plate 130.

For example, the gate electrode 106, the first plate 130 and the second plate 131 may be made of a metal material or an alloy material, for example, molybdenum, aluminum, titanium, etc. The source electrode 110 and the drain electrode 111 may be made of a metal material or an alloy material, for example, a metal single-layer or multi-layer structure (for example, the multi-layer structure is a laminate of multiple metal layers, such as a laminate of three layers of metals of titanium, aluminum and titanium (Al/Ti/Al)) formed by molybdenum, aluminum, titanium, etc.

Each of the display device is located in the display region. The display device may include the first electrode 112 and a pixel definition portion 113 sequentially formed on the inter-layer dielectric layer 103. It should be understood that the display device may further include a light emitting portion 114a and a second electrode 115.

It should be noted that, the first electrode 112, the light emitting portion 114a and the second electrode 115 can form one light emitting sub-pixel 1d. A part of the display devices in the display region 10a may include a plurality of light emitting sub-pixels 1d arranged in an array. Furthermore, it is noted that the first electrodes 112 of the light emitting sub-pixels 1d are independent of each other, and the second electrodes 115 of the light emitting sub-pixels 1d are connected with each other in a manner of forming a planar electrode. That is, the second electrodes 115 are an entire planar structure disposed on the display panel 10 to serve as common electrodes of a plurality of display devices.

A support portion 132 is further disposed at a side of the pixel definition portion 113 away from the inter-layer dielectric layer 103. The support portions 132 can achieve the effect of supporting a protective film layer (not shown) to avoid damage to the first electrodes 112 or other wirings due to contact between the protective film layer and the first electrodes 112 or other wirings. It should be noted that, the protective film layer is mainly used in a transfer process of semi-finished products to avoid damage to the semi-finished products during the transfer process. In some embodiments, when a substrate with finished support portions 132 is transferred to an evaporation production line, one protective film layer may be covered on the substrate. When it is necessary to perform evaporation of light emitting material, the protective film layer can be removed.

The mounting hole blocking column is disposed by surrounding the hole region 10b and may include at least one sub-mounting hole blocking column. The at least one sub-mounting hole blocking column may include at least one organic layer, for example, may include at least one layer of the planarization portion 116, the pixel definition portion 113 and the support portion 132. The film layer formation structures of a plurality of sub-mounting hole blocking column may be same or different. The heights of a plurality of sub-mounting hole blocking columns may be same or different. Of course, the at least one sub-mounting hole blocking column may further include another film layer, for example, a metal layer or inorganic layer or the like. In the present embodiment, the mounting hole blocking column includes a first mounting hole blocking column 1a and a second mounting hole blocking column 1b.

The first mounting hole blocking column 1a is disposed by surrounding the hole region 10b. The first mounting hole blocking column 1a may include a first blocking portion 117. When the display panel 10 is encapsulated using the encapsulation layer 118, the first blocking portion 117 can restrict flow of the material of the organic encapsulation film layer in the encapsulation layer 118 so as to prevent the material of the organic encapsulation film layer in the encapsulation layer 118 from flowing to the hole region 10b, thereby avoiding encapsulation failure. That is, the first blocking portion 117 of the first mounting hole blocking column 1a can cooperate with the encapsulation layer 118 to effectively block water and oxygen from entering the display region 10a through the hole region 10b, thereby avoiding poor display effect caused by failure of the light emitting portion 114a of the display region 10a and extending the service life of the product.

The first mounting hole blocking column 1a further includes a first protection portion 119 formed on the inter-layer dielectric layer 103, and the above first blocking portion 117 is disposed at a side of the first protection portion 119 away from the inter-layer dielectric layer 103. That is, according to an embodiment of the present disclosure, before the first mounting hole blocking column 1a is prepared, the first protection portion 119 is firstly formed on a surface of the inter-layer dielectric layer 103 in a transition region 10c, and then, the first blocking portion 117 is formed on the side of the first protection portion 119 away from the inter-layer dielectric layer 103. By disposing the first protection portion 119, the surface of the inter-layer dielectric layer 103 in the transition region 10c can be protected before the first blocking portion 117 is prepared, so as to reduce the number of times that the inter-layer dielectric layer 103 in the transition region 10c is cleaned by an etching solution. In this way, the adhesion force of the inter-layer dielectric layer 103 in the transition layer 10c can be improved so as to ensure stable combination of the first mounting hole blocking column 1a and the inter-layer dielectric layer 103. Thus, the risk that the first mounting hole blocking column 1a is debonded during a process can be effectively reduced and further, the risk of encapsulation failure can be reduced, thereby increasing an encapsulation yield and ensuring display effect and product service life.

The second mounting hole blocking column 1b is located at a side of the first mounting hole blocking column 1a away from the display region 10a and surrounds the hole region 10b. The second mounting hole blocking column 1b has a larger thickness than the first mounting hole blocking column 1a. Thus, the second mounting hole blocking column 1b can further restrict the flow of the material of the organic encapsulation film layer of the encapsulation layer 118 to prevent the material of the organic encapsulation film layer in the encapsulation layer 118 from flowing to the hole region 10b, thereby avoiding encapsulation failure.

The second mounting hole blocking column 1b may include a second protection portion 120 and a second blocking portion 121 formed on a side of the second protection portion 120 away from the inter-layer dielectric layer 103, where the second blocking portion 121 and the first blocking portion 117 are disposed in a same layer. That is, the second blocking portion 121, the first blocking portion 117 and the pixel definition portion 113 are formed at the same time through one patterning process, so as to reduce the processing steps and mask use, thus lowering the costs.

Further, it should be understood that the first blocking portion 117 and the second blocking portion 121 should be disconnected from each other such that blocking and encapsulation path can be increased so as to further increase the encapsulation effect.

In some embodiments, when the first protection portion 119, the second protection portion 120 and the planarization portion 116 are disposed in a same layer, if the planarization portion 116 is a double-layer structure including a first planarization film layer and a second planarization film layer, the first protection portion 119 and the second protection portion 120 can also be double-layer structures. Each of the first protection portion 119 and the second protection portion 120 includes a film layer disposed in the same layer as the first planarization film layer, and a film layer disposed in the same layer as the second planarization film layer. In some embodiments, the second protection portion 120 is a double-layer structure and the first protection portion 119 is a single-layer structure (i.e. the first protection portion 119 only includes a film layer disposed in the same layer as the second planarization film layer). In some embodiments, each of the first protection portion 119 and the second protection portion 120 is a single-layer structure only including a film layer disposed in the same layer as the second planarization film layer.

As shown in FIG. 5, at least one of the first mounting hole blocking column 1a and the second mounting hole blocking column 1b further includes a photo spacer (PS). The photo spacer can be formed at a side of the first blocking portion 117 or the second blocking portion 121 away from the inter-layer dielectric layer 103, and can increase the thickness of the first mounting hole blocking column 1a or the second mounting hole blocking column 1b. This photo spacer can block the material of the organic encapsulation film layer in the encapsulation layer 118 from flowing to the hole region 10b to further restrict the flow of the material of the organic encapsulation film layer in the encapsulation layer 118, further increasing the encapsulation reliability of the display panel 10.

For example, the above photo spacer can be disposed in the same layer as the support portion 132 of the display region 10a. The photo spacer formed on the first blocking portion 117 can be defined as a first photo spacer 122, and the photo spacer formed on the second blocking portion 121 can be defined as a second photo spacer 123. The first photo spacer 122 and the first blocking portion 117 may be made of a same material and can be formed in one patterning process (e.g. gray level masking process) to increase the structural stability of each layer of the first mounting hole blocking column 1a. In some embodiments, the first photo spacer 122 and the first blocking portion 117 may be made of different materials and can be formed in different patterning processes. Similarly, the second photo spacer 123 and the second blocking portion 121 may be made of a same material and can be formed in one patterning process (e.g. gray level masking process) to increase the structural stability of each layer of the second mounting hole blocking column 1b. In some embodiments, the second photo spacer 123 and the second blocking portion 121 may be made of different materials and can be formed in different patterning processes.

The display region blocking column is disposed by surrounding the periphery of the display region 10a, and the display region blocking column may have the same structure as the mounting hole blocking column and will not be repeated herein. In some embodiments, the display region blocking column may be different in structure from the mounting hole blocking column, for example, may include a different number of sub-blocking columns or a different sub-blocking column height or a different film layer composition structure.

The encapsulation layer 188 may include a first inorganic encapsulation film layer 118a, an organic encapsulation film layer 118b and a second inorganic encapsulation film layer 118c stacked in sequence, where the organic encapsulation film layer 118b is the above planarization layer. The first inorganic encapsulation film layer 118a encapsulates the display device, the first mounting hole blocking column 1a and the second mounting hole blocking column 1b. The organic encapsulation film layer 118b encapsulates the display device and terminates at a side of the first mounting hole blocking column 1a close to the display region 10a. The second inorganic encapsulation film layer 118c encapsulates the display device, the first mounting hole blocking column 1a and the second mounting hole blocking column 1b. The first inorganic encapsulation film layer 118a and the second inorganic encapsulation film layer 118c are used to prevent water and oxygen from entering the light emitting portion 114a of the display region 10a through the display side of the display region and the hole region 10b. The first inorganic encapsulation film layer 118a and the second inorganic encapsulation film layer 118c can be made of inorganic materials such as silicon nitride and silicon oxide and the like. The organic encapsulation film layer 118b is used to achieve planarization to facilitate preparation of the second inorganic encapsulation film layer 118c. The organic encapsulation film layer 118b may be made of materials such as acrylic-based polymer and silicon-based polymer etc.

An embodiment of the present disclosure further provides a display apparatus, including the display panel described in the preceding embodiments. Hole opening can be performed in the hole region of the display panel to form a hole. The display apparatus further includes a functional device such as camera, sensor, HOME button, receiver or loudspeaker or the like disposed in the hole.

According to the embodiments of the present disclosure, the specific type of the display apparatus is not specially limited and may be a common display apparatus in the prior art, for example, may be Organic Light-Emitting Diode (OLED) display screen, mobile apparatus such as mobile phone, wearable devices such as wrist watch, and Virtual Reality (VR) apparatus and the like. Those skilled in the art may make corresponding selection based on the specific use of the display apparatus, which will not be repeated herein.

It should be noted that, in addition to the display panel, the camera, the sensor, the HOME button, the receiver or the loudspeaker or the like, the display apparatus further includes other necessary component or parts. For example, a display device may include a housing, a power cord and a drive chip and the like. Those skilled in the art may make corresponding supplementation based on the specific use requirements of the display apparatus, which will not be redundantly described herein.

The above are only preferred embodiments of the present disclosure and not intended to limit the present disclosure. Any modifications, equivalent substitutions and improvements and the like made within the spirit and principle of the present disclosure shall all fall within the scope of protection of the present disclosure.

The invention claimed is:

1. An array substrate, comprising a display region and a mounting hole located in the display region, wherein a mounting hole blocking column is disposed at a periphery of the mounting hole, a display region blocking column is disposed at a periphery of the display region, and a side of the mounting hole where a part of the mounting hole blocking column from which a distance of the display region blocking column is less than or equal to 2000 μm is located is denoted as a first side;

the array substrate further comprises a first metal electrode structure, where the first metal electrode structure comprises a plurality of first metal electrodes disposed along a direction perpendicular to the first side, and each of the first metal electrodes comprises a plurality of first metal electrode blocks electrically connected with each other in sequence; and a size of a first metal electrode block adjoining the first side of the mounting hole expands outwardly in a direction of the first side on a basis of a size of a first metal electrode block not adjoining the first side of the mounting hole.

2. The array substrate of claim 1, wherein the size of the first metal electrode block adjoining the first side of the mounting hole expands toward both sides along the direction of the first side or expands unilaterally toward a neighboring end point of the first side on the basis of the size of the first metal electrode block not adjoining the first side of the mounting hole.

3. The array substrate of claim 2, wherein an area of the first metal electrode block adjoining the first side of the mounting hole expands by 10% to 50% on a basis of an area of the first metal electrode block not adjoining the first side of the mounting hole.

4. The array substrate of claim 1, wherein an area of the first metal electrode block adjoining the first side of the mounting hole expands by 10% to 50% on a basis of an area of the first metal electrode block not adjoining the first side of the mounting hole.

5. The array substrate of claim 1, wherein an edge, in close contact with the mounting hole, of the first metal electrode block adjoining the first side of the mounting hole has a length of 3500 μm to 4900 μm.

6. The array substrate of claim 1, wherein two adjacent first metal electrodes are not mutually overlapped.

7. The array substrate of claim 1, further comprising a second metal electrode structure, wherein the second metal electrode structure comprises a plurality of second metal electrodes disposed along a direction parallel to the first side, and each of the second metal electrodes comprises a plurality of second metal electrode blocks electrically connected with each other in sequence.

8. The array substrate of claim 7, wherein a size of a second metal electrode block adjoining the first side of the mounting hole shrinks inwardly along the direction of the first side on a basis of a shape of a second metal electrode block not adjoining the mounting hole, and
a decrease in the size of the second metal electrode block due to shrinking inwardly corresponds to an increase in the size of the first metal electrode block adjoining the second metal electrode block due to expanding outwardly.

9. The array substrate of claim 1, wherein a planarization layer is formed under the first metal electrode structure, and the planarization layer comprises a climbing region located in a region in which a distance between the mounting hole blocking column and the display region blocking column is less than or equal to 2000 μm, and
the first metal electrode block, after size expansion, has at least partial region not having overlapping area with the climbing region of the planarization layer.

10. The array substrate of claim 1, wherein the mounting hole further comprises a second side opposed to the first side, first metal electrode blocks respectively adjoining the first side and the second side in the first metal electrode are connected with each other through a first metal connection line, and the first metal connection line is disposed along the periphery of the mounting hole.

11. A display panel, comprising an array substrate comprising a display region and a mounting hole located in the display region, wherein a mounting hole blocking column is disposed at a periphery of the mounting hole, a display region blocking column is disposed at a periphery of the display region, and a side of the mounting hole where a part of the mounting hole blocking column from which a distance of the display region blocking column is less than or equal to 2000 μm is located is denoted as a first side;
the array substrate further comprises a first metal electrode structure, where the first metal electrode structure comprises a plurality of first metal electrodes disposed along a direction perpendicular to the first side, and each of the first metal electrodes comprises a plurality of first metal electrode blocks electrically connected with each other in sequence; and
a size of a first metal electrode block adjoining the first side of the mounting hole expands outwardly in a direction of the first side on a basis of a size of a first metal electrode block not adjoining the first side of the mounting hole.

12. The display panel of claim 11, wherein the size of the first metal electrode block adjoining the first side of the mounting hole expands toward both sides along the direction of the first side or expands unilaterally toward a neighboring end point of the first side on the basis of the size of the first metal electrode block not adjoining the first side of the mounting hole.

13. The display panel of claim 11, wherein an area of the first metal electrode block adjoining the first side of the mounting hole expands by 10% to 50% on a basis of an area of the first metal electrode block not adjoining the first side of the mounting hole.

14. The display panel of claim 11, wherein an edge, in close contact with the mounting hole, of the first metal electrode block adjoining the first side of the mounting hole has a length of 3500 μm to 4900 μm.

15. The display panel of claim 11, wherein two adjacent first metal electrodes are not mutually overlapped.

16. The display panel of claim 11, wherein the array substrate further comprises a second metal electrode structure, and
the second metal electrode structure comprises a plurality of second metal electrodes disposed along a direction parallel to the first side, and each of the second metal electrodes comprises a plurality of second metal electrode blocks electrically connected with each other in sequence.

17. The display panel of claim 16, wherein a size of a second metal electrode block adjoining the first side of the mounting hole shrinks inwardly along the direction of the first side on a basis of a shape of a second metal electrode block not adjoining the mounting hole, and
a decrease in the size of the second metal electrode block due to shrinking inwardly corresponds to an increase in the size of the first metal electrode block adjoining the second metal electrode block due to expanding outwardly.

18. The display panel of claim 11, wherein a planarization layer is formed under the first metal electrode structure, and the planarization layer comprises a climbing region located in a region in which a distance between the mounting hole blocking column and the display region blocking column is less than or equal to 2000 μm, and
the first metal electrode block, after size expansion, has at least partial region not having overlapping area with the climbing region of the planarization layer.

19. The display panel of claim 11, wherein the mounting hole further comprises a second side opposed to the first side, first metal electrode blocks respectively adjoining the first side and the second side in the first metal electrode are connected with each other through a first metal connection line, and the first metal connection line is disposed along the periphery of the mounting hole.

20. A display apparatus, comprising a display panel comprising an array substrate, and the array substrate comprises a display region and a mounting hole located in the display region, wherein a mounting hole blocking column is disposed at a periphery of the mounting hole, a display region blocking column is disposed at a periphery of the display region, and a side of the mounting hole where a part of the mounting hole blocking column from which a distance of the display region blocking column is less than or equal to 2000 µm is located is denoted as a first side;

the array substrate further comprises a first metal electrode structure, where the first metal electrode structure comprises a plurality of first metal electrodes disposed along a direction perpendicular to the first side, and each of the first metal electrodes comprises a plurality of first metal electrode blocks electrically connected with each other in sequence; and a size of a first metal electrode block adjoining the first side of the mounting hole expands outwardly in a direction of the first side on a basis of a size of a first metal electrode block not adjoining the first side of the mounting hole.

\* \* \* \* \*